(12) United States Patent
Ren et al.

(10) Patent No.: US 7,696,260 B2
(45) Date of Patent: Apr. 13, 2010

(54) CATIONIC COMPOSITIONS AND METHODS OF MAKING AND USING THE SAME

(75) Inventors: Kangtal Ren, Geneva, IL (US); John A. Lawton, Landenberg, PA (US)

(73) Assignee: DSM IP Assets B.V., Heerlen (NL)

( * ) Notice: Subject to any disclaimer, the term of this patent is extended or adjusted under 35 U.S.C. 154(b) by 907 days.

(21) Appl. No.: 11/392,866

(22) Filed: Mar. 30, 2006

(65) Prior Publication Data

US 2007/0228614 A1    Oct. 4, 2007

(51) Int. Cl.
*C08F 2/50* (2006.01)
*C08F 2/46* (2006.01)
*C08J 3/28* (2006.01)

(52) U.S. Cl. ............... 522/168; 522/170; 522/181; 522/25; 264/401; 264/219; 264/220; 428/411.1; 428/413; 427/508; 427/510; 427/512; 427/517; 252/186.1; 252/186.21; 252/187.1

(58) Field of Classification Search ............ 264/401, 264/219, 220; 522/168, 170, 25, 181; 428/411.1, 428/413; 427/508, 510, 512, 517; 252/186.1, 252/186.21, 187.1, 183.1, 183.11
See application file for complete search history.

(56) References Cited

U.S. PATENT DOCUMENTS

| | | | | |
|---|---|---|---|---|
| 5,494,618 A | * | 2/1996 | Sitzmann et al. | ............ 264/401 |
| 5,973,020 A | | 10/1999 | Kerr, III et al. | |
| 6,130,025 A | * | 10/2000 | Chikaoka et al. | ......... 430/280.1 |
| 6,649,259 B1 | | 11/2003 | Hu et al. | |
| 6,685,869 B2 | | 2/2004 | Yamamura et al. | |
| 6,967,224 B2 | | 11/2005 | Yamamura et al. | |
| 2005/0250868 A1 | * | 11/2005 | Suzuki et al. | ................. 522/25 |
| 2006/0172230 A1 | * | 8/2006 | Lawton et al. | .............. 430/322 |

FOREIGN PATENT DOCUMENTS

WO    WO 2005/070989    8/2005

* cited by examiner

*Primary Examiner*—Sanza L McClendon
(74) *Attorney, Agent, or Firm*—Nixon & Vanderhye, P.C.

(57) ABSTRACT

A composition comprising a cationically-polymerizable compound, an iodonium-based cationic initiator, a sensitizer for said cationic initiator and an antioxidant selected from the group consisting of phenol antioxidants, lactone antioxidants, and combinations of these antioxidants is provided. The addition of this antioxidant to this composition contributes to the reduction of potential run-away reaction when it is exposed in-bulk to actinic radiation.

19 Claims, No Drawings

CATIONIC COMPOSITIONS AND METHODS OF MAKING AND USING THE SAME

FIELD OF THE INVENTION

This invention relates to cationic compositions and to methods of making and using the same. In preferred embodiments, the present invention relates to iodonium-based cationically-curable compositions containing phenol and/or lactone antioxidants and methods that contribute to the reduction of potential run-away reaction when the compositions are exposed in-bulk to actinic radiation.

BACKGROUND OF THE INVENTION

Cationically-polymerizable iodonium-based formulations are known in the art. Various means to enhance the shelf-stability of such formulations utilizing particular stabilizers have been taught, however the art has not dealt with reduction of run-away reactions when iodonium-based cationically-polymerizable compositions are exposed in-bulk to actinic radiation.

U.S. Pat. No. 5,973,020 describes tetrakis (pentafluorophenyl) borate tolylcumyliodonium and diacetone mixtures containing amino agent stabilizers. It is suggested that such mixtures provide improved shelf-stability.

WO 2005/070989 A2 teaches the use of organic phosphorous stabilizers and hindered nitroxyl stabilizers in cationically-polymerizable formulations to improve shelf stability.

U.S. Pat. No. 6,649,259 B1 discloses a cationically-polymerizable iodonium-based epoxy composition containing a hindered phenol antioxidant. The composition is used as an adhesive coating on a heat-shrinkable polymer film.

Although previously disclosed stabilizers may be useful in improving shelf-life stability, such stabilizers are often of sufficient basicity to reduce cure speeds in cure sensitive cationic applications and to limit continued dark-reaction cationic cure in applications such as stereolithography.

SUMMARY OF THE INVENTION

The present invention relates to cationically-polymerizable iodonium-based compositions comprising phenol and/or lactone antioxidants which are essentially neutral to slightly acidic. The addition of said phenol and/or lactone antioxidants is effective in reducing run-away polymerization induced by exposure of the formulation to actinic radiation in-bulk. The addition of said phenol and/or lactones antioxidants reduces the degradation of cure upon imagewise actinic exposure and the degradation of dark-reaction cure after the actinic exposure has completed.

This invention is embodied in compositions comprising:
 a) a cationically polymerizable compound;
 b) an iodonium-based cationic initiator;
 c) a photosensitizer for said cationic initiator; and
 d) an antioxidant selected from the group consisting of phenol antioxidants, lactone antioxidants, and combinations of phenol and lactone antioxidants.

According to some embodiments, the antioxidant is present in an amount sufficient to reduce the tendency of a run-away reaction when the composition is exposed in-bulk to actinic radiation. In some preferred embodiments, the compositions of the present invention comprise an antioxidant in an amount of between 0.01 wt % to 2 wt %, relative to the total weight of the composition.

The cationically polymerizable compound employed in the embodiments of the present invention preferably comprises at least one of epoxide-containing compounds such as glycidyl epoxy, cycloaliphatic epoxy and the like, oxetanes and hydroxyl-functional compounds.

The compositions of the present invention in yet another aspect are hybrid compositions, and as such, may include (meth)acrylate compounds and free-radical initiators.

Another embodiment of the present invention is a process of making a three-dimensional article comprising forming a mold from the compositions of the present invention and forming a thermoplastic sheet on the mold via vacuum-forming techniques.

In another aspect, the present invention is embodied in a mold or pattern formed from the compositions of the inventions.

In yet another aspect, the present invention is embodied in a method of forming a cationically cured material comprising subjecting the cationically curable composition to cationic curing conditions for a time sufficient to form a cured material therefrom. Preferred embodiments of the invention are methods of forming a three-dimensional article by means of stereolithography by (a) coating a layer of the cationically curable composition as described herein onto a surface; (b) exposing the layer imagewise to actinic radiation to form an imaged cross-section, wherein the radiation provides sufficient exposure to cause substantial curing of the layer in the exposed areas; (c) coating a layer of the composition onto the previously exposed imaged cross-section; (d) exposing the layer from step (c) to imagewise actinic radiation to form an additional imaged cross-section, wherein the radiation is of sufficient intensity to cause substantial curing of the layer in the exposed areas and to cause adhesion to the previously exposed imaged cross-section; and (e) repeating steps (c) and (d) a sufficient number of times in order to build up the three-dimensional article. This article can be a mold or a pattern, for example, Quick-Cast pattern.

The present invention provides a method of forming a cationically cured material comprising subjecting the cationically curable composition to cationic curing conditions for a period of time sufficient to form a cured material therefrom.

The present invention further provides a method of fabricating stereolithographic pattern comprising a) preparing an iodonium-based cationic curable composition, and b) exposing said composition to actinic radiation.

The present invention also provides a method of reducing the potential for a run-away polymerization in a process which exposes a polymerizable composition to actinic radiation by incorporating into an iodonium-based composition an amount of an antioxidant sufficient to reduce the potential for run-away polymerization when the composition is exposed in-bulk to actinic radiation, wherein the antioxidant is selected from the group consisting of phenol antioxidants, lactone antioxidants and combinations of phenol and lactone antioxidants.

This invention is useful in processes where the exposure is an imaging exposure or a flood exposure. Such processes are, for example, stereolithography processes or printing plate processes. The addition of phenol and lactone antioxidants to cationically-polymerizable iodonium-based formulations is especially useful in applications such as stereolithography where the formulation is exposed imagewise in a manner that initiates the cationic cure but does not immediately lead to a complete cure. The compositions of the present invention are adapted for reducing the tendency of run-away reaction when they are exposed in-bulk to actinic radiation.

DETAILED DESCRIPTION OF THE INVENTION

Certain terms, define below, are used herein to define certain chemicals and concepts:

"Exposure in-bulk" refers to an actinic exposure of a coated formulation having a thickness of 0.4 cm or more when coated on a surface or when contained within a vat, as is the case in, for example, stereolithography, which has vat depths typically greater than several centimeters.

"Flood exposure" refers to the exposure of the surface of the photopolymer to actinic radiation wherein the amount of surface actinically exposed at any one time is 50% or greater than the total photopolymer surface available for exposure. For example, if the exposure of a photopolymer surface is through a mask that transmits or reflects greater than 50% of actinic light such that it exposes greater than 50% of the photopolymer surface at a time, this would be a flood exposure. However if the exposure is accomplished, for example using a scanning laser beam over the photopolymer surface, such exposure would be an "imagewise exposure". Even if a laser-scanned imagewise exposure provided greater than 50% exposure to the photopolymer surface, it would not give the exposure all at one time, rather the exposure would occur in one area then in another area over time. If a mask blocks 50% or more of the light from the photopolymer surface, such would be an imagewise exposure. As such, placement of a stereolithography vat, with the photopolymer surface unprotected from the light, in a sunlit window would constitute a flood exposure if the sunlight was illuminating greater than 50% of the photopolymer surface at any time.

"Phenol antioxidants" refers to antioxidants that contain phenol ring, naphthol ring, phenanthrol ring and/or anthrol ring in their structures.

The present invention relates, inter alia, to a composition comprising:
a) a cationically polymerizable compound;
b) an iodonium-based cationic initiator;
e) a photosensitizer for said cationic initiator; and,
f) an antioxidant selected from the group consisting of phenol antioxidants, lactone antioxidants, and combinations of these antioxidants.

During the development of a cationically-polymerizable composition for use in stereolithography, laboratory practice was to prepare small formulations of experimental composition; to pour such composition into a polystyrene petri-dish; to perform various experiments on the composition; and then to place the petri-dish into a actinic light post-curing apparatus in order to harden the composition by flood exposure. Although such laboratory practice was essentially without incident when dealing with non-iodonium-based cationically-polymerizable compositions, such as sulphonium-based compositions, the practice led to run-away polymerizations involving smoking, spattering, and possibly ignition when used with iodonium-based compositions.

Typically the cationically-polymerizable formulations comprising iodonium cationic initiators are utilized in conditions where the thickness of a coated formulation is relatively thin prior to exposure. In a thin coating there is little chance of run-away exothermic polymerization since the heat generated during cure is easily absorbed by the surroundings, such as the atmosphere or a coated substrate. Problems occur under conditions where the formulation is flood-exposed to actinic light in-bulk and where the heat from exotherm can build-up within the polymerizing and potentially-polymerizing composition. Bulk exposure conditions, especially conditions where the actinic radiation can be absorbed from many directions, such as a flood exposure, lead to run-away exothermic polymerization problems that the instant invention serves to diminish.

The tendency for the iodonium-based cationically-polymerizable compositions to exhibit such run-away reactions, when exposed in-bulk to actinic radiation, led to safety considerations during use of such compositions by customers and during shipping. As an example, if during shipment of a composition based upon the iodonium initiator chemistry a container were to be dropped leading to leakage and pooling of the composition on pavement or airport tarmac on a sunny day, the run-away polymerization induced by the actinic exposure from the sun might shut-down the highway or might lead to shut-down of an airport. Or suppose a stereolithography customer were to remove a vat of iodonium-based cationically-polymerizable resin from a stereolithography machine and place it uncovered in front of a window through which sunlight was streaming. The vat of resin, if an actinic-induced run-away reaction occurred, might lead to fire or exposure of personnel to dangerous fumes from the resin combustion.

Such potential situations and others led to a need to try to stabilize the iodonium-based cationically-polymerizable compositions, in order to minimize the potential of a run-away reaction, without substantially harming the performance of the composition during imagewise actinic exposure or during the essentially dark-reaction period of cationic post-cure.

Alternatively, another commercial application of iodonium-based compositions is in the production of patterns via stereolithography, for example, for investment casting. It is well known in the stereolithographic art that patterns, for example "Quick-Cast" patterns, can be made via stereolithography. Quick-Cast patterns have an outer skin that matches the perimeter of a part to be molded and also have an internal scaffold-like structure. The scaffold-like structure ensures suitable structural integrity for the skin while allowing drainage of uncured resin from within the pattern skin. After fabrication of a Quick-Cast pattern via stereolithography, the pattern may be drained of internal uncured resin and then the pattern may be dipped in various ceramic slurry baths to build-up a pre-ceramic shell around the pattern. Next the pattern with surrounding pre-ceramic shell is heated and fired in various steps in order to harden the pre-ceramic into a ceramic investment casting mold. During this process, the pattern is burned out resulting in the ceramic investment cast mold.

Presently, the industry is concerned with antimony-containing stereolithographic patterns where there is sometimes a problem in that the antimony is not completely burned-out, leaving some antimony content remains present with the ceramic mold. Then when a molten metal is poured into the ceramic shell, the residual antimony interacts with the metal producing metal parts with surface faults or metal alloy regions in the parts that have undesirable physical properties (e.g., a tendency to crack or a lower melting point). Such problems are more significant for superalloy parts, for example, for turbines that are cast for use in turbine engines. Iodonium-based cationic initiators that do not contain antimony are preferred for such applications. However, when using the iodonium-based cationically-curable compositions to produce pattern such as Quick-Cast, sometimes regions of the Quick-Cast pattern are not completely drained. If the Quick-Cast pattern is post cured in a PCA (post-curing apparatus), and if it contains undrained composition in-bulk, there is a chance of a run-away reaction.

Various approaches for reducing the potential for such run-away reaction were investigated. Hindered amines, weak bases such as polyvinylpyrrolidone, amphoteric salts like potassium bicarbonate, thermally unstable blocked bases (i.e. components that chemically open-up and reveal a more basic character upon heating, for example urethanes) and the like were explored. While the addition of weakly basic materials has been recommended for improving shelf life of formulations comprising iodonium cationic initiators, such a solution does not provide stability to systems destabilized due to actinic light exposure in-bulk. Although some of these components, when added to an iodonium-based cationically-polymerizable composition, reduced and sometimes eliminated a run-away reaction upon actinic exposure in-bulk at certain concentration levels, they also had a strong tendency to decrease the green strength of an imaged region and inhibited the progression of cure after the imaging was completed. However, it was discovered that the addition of phenol and lactone antioxidants, that are neutral or slightly acidic, reduced the tendency of thermal run-away and did not have a significant effect on green strength or dark-reaction post cure.

Without being bound or limited by any theory, it is suggested that the antioxidant provides stability by scavenging the radicals that are generated by actinic light exposure and those that may be thermally generated during a run-away exotherm of a polymerizing formulation. As such, any acid that is generated due to actinic exposure, assuming insufficient radical scavenging during the exposure, remains available for initiating polymerization of cationically polymerizable components when antioxidants are used. Accordingly antioxidants may limit the initiating cause of the run-away polymerization (i.e. actinic and high-temperature thermally-induced radical production which lead to new cationic species by radical attack of the iodonium-based cationic initiator), but have little effect on the residual cationic species generated as a result of an imagewise actinic exposure.

In photopolymer compositions contemplated by this invention, common components include epoxides, hydroxy-functional compound, oxetanes, (meth)acrylates, photoinitiators, free radical initiators, sensitizers, and other additives. Examples of each of these groups are described below. Different combinations of these can be used as stereolithography compositions or compositions for other photo-imaging applications.

Cationically Curable Compounds

Epoxides

The epoxide-containing materials, also referred to as epoxy materials, can be cationically curable. This means that polymerization and/or crosslinking and other reactions of the epoxy group can be initiated by cations. These materials may be monomers, oligomers or polymers. Such materials may have an aliphatic, aromatic, cycloaliphatic, arylaliphatic or heterocyclic structure; they can comprise epoxide groups as side groups or groups that form part of an alicyclic or heterocyclic ring system. Epoxy of those types include those that are generally known and are commercially available.

The composition may contain one or more epoxies. Preferably, the composition will comprise at least one liquid (at room temperature, 23° C.) component such that the combination of materials is a liquid. Thus, the epoxide-containing material is preferably a single liquid epoxy material, a combination of liquid epoxy materials, or a combination of liquid epoxy material(s) and solid epoxy material(s) which is soluble in the liquid. However, in certain embodiments, e.g. in embodiments where the epoxide material is soluble in other components of the composition, the epoxide material may be comprised only of materials that are solid at room temperature. When solid compositions are used, the compositions may be thinned or liquefied by applying shear and/or heat prior to or during use.

Examples of suitable epoxy materials include polyglycidyl and poly(methylglycidyl) esters of polycarboxylic acids, or poly(oxiranyl)ethers of polyethers. The polycarboxylic acid can be aliphatic, such as, for example, glutaric acid, adipic acid and the like; cycloaliphatic, such as, for example, tetrahydrophthalic acid; or aromatic, such as, for example, phthalic acid, isophthalic acid, trimellitic acid, or pyromellitic acid. The polyether can be poly(tetramethylene oxide). These compounds can be used either individually or in combination of two or more.

Other suitable epoxy materials also include polyglycidyl or poly(-methylglycidyl)ethers obtainable by the reaction of a compound having at least one free alcoholic hydroxy group and/or phenolic hydroxy group and a suitably substituted epichlorohydrin. The alcohols can be acyclic alcohols, such as, for example, ethylene glycol, diethylene glycol, and higher poly(oxyethylene) glycols; cycloaliphatic, such as, for example, 1,3- or 1,4-dihydroxycyclohexane, bis(4-hydroxycyclohexyl)methane, 2,2-bis(4-hydroxycyclohexyl)propane, or 1,1-bis(hydroxymethyl)cyclohex-3-ene; or contain aromatic nuclei, such as N,N-bis(2-hydroxyethyl)aniline or p,p'-bis(2-hydroxyethylamino)diphenylmethane. These compounds can be used either individually or in combination of two or more.

Other suitable epoxy compounds include those which may be derived from mono nuclear phenols, such as, for example, resorcinol or hydroquinone, or they may be based on polynuclear phenols, such as, for example, bis(4-hydroxyphenyl) methane (bisphenol F), 2,2-bis(4-hydroxyphenyl)propane (bisphenol A), or on condensation products, obtained under acidic conditions, of phenols or cresols with formaldehyde, such as phenol novolacs and cresol novolacs. These compounds can be used either individually or in combination of two or more.

Suitable epoxy materials also include poly(N-glycidyl) compounds, which are, for example, obtainable by dehydrochlorination of the reaction products of epichlorohydrin with amines that comprise at least two amine hydrogen atoms, such as, for example, n-butylamine, aniline, toluidine, m-xylene diamine, bis(4-aminophenyl)methane or bis(4-methylaminophenyl)methane. Suitable poly(N-glycidyl) compounds also include N,N'-diglycidyl derivatives of cycloalkyleneureas, such as ethyleneurea or 1,3-propyleneurea, and N,N'-diglycidyl derivatives of hydantoins, such as 5,5-dimethylhydantoin. These compounds can be used either individually or in combination of two or more.

Examples of suitable epoxy materials include poly(S-glycidyl) compounds which are di-S-glycidyl derivatives which are derived from dithiols such as, for example, ethane-1,2-dithiol or bis(4-mercaptomethylphenyl)ether.

Epoxide-containing materials can be selected from the group consisting of bis(2,3-epoxycyclopentyl)ether, 2,3-epoxy cyclopentyl glycidyl ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexane, 3,4-epoxy-6-methylcyclohexylmethyl-3,4-epoxy-6-methylcyclohexanecarboxylate, di(3,4-epoxycyclohexylmethyl) hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, vinylcyclohexene dioxide, dicyclopentadiene diepoxide, .alpha.-(oxiranylmethyl)-.omega.-(oxiranylmethoxy) poly(oxy-1,4-butanediyl), diglycidyl ether of neopentyl glycol, or 2-(3,4-epoxycyclohexyl-5,5-spiro-3,4-epoxy)cyclohexane-1,3-dioxane, and combinations thereof. These compounds can be used either individually or in combination of two or more.

It is, however, also possible to use epoxies in which the 1,2-epoxy groups are bonded to different heteroatoms or functional groups. Those compounds include, for example, the N,N,O-triglycidyl derivative of 4-aminophenol, the glycidyl ether glycidyl ester of salicylic acid, N-glycidyl-N'-(2-glycidyloxypropyl)-5,5-dimethylhydantoin, or 2-glycidyloxy-1,3-bis(5,5-dimethyl-1-glycidylhydantoin-3-yl) propane. In addition, liquid pre-reacted adducts of such epoxies with hardeners are suitable for epoxies.

Additional epoxy materials include cycloaliphatic diepoxides such as bis(4-hydroxycyclohexyl)methane diglycidyl ether, 2,2-bis(4-hydroxycyclohexyl)propane diglycidyl ether, 3,4-epoxycyclohexylmethyl-3,4-epoxycyclohexanecarboxylate, 3,4-epoxy-6-methylcyclohexylmethyl-3,4-epoxy-6-methylcyclohexanecarboxylate, di(3,4-epoxycyclohexylmethyl)hexanedioate, di(3,4-epoxy-6-methylcyclohexylmethyl)hexanedioate, ethylenebis(3,4-epoxycyclohexanecarboxylate), ethanedioldi(3,4-epoxycyclohexylmethyl)ether, 2-(3,4-epoxycyclohexyl-5,5-spiro-3,4-epoxy)cyclohexane-1,3-dioxane, and combinations thereof. These compounds can be used either individually or in combination of two or more.

Other epoxy compounds comprise at least one cyclohexeneoxide structure, preferably at least 2 cyclohexeneoxide structures.

In the present invention, one of the preferred epoxide groups is glycidyl epoxy.

The epoxy materials can have molecular weights which vary over a wide range. In general, the epoxy equivalent weight, i.e., the number average molecular weight divided by the number of reactive epoxy groups, is preferably in the range of 60 to 1000.

The present composition can comprise, relative to the total weight of the composition, 10 wt % to 99.5 wt % of one or more epoxies. It can also comprise 20 wt % to 85 wt % of one or more epoxies, relative to the total weight of the composition.

Oxetanes

The following compounds are examples of oxetane compounds having one oxetane ring in the molecule, 3-ethyl-3-hydroxymethyloxetane, 3-(meth)allyloxymethyl-3-ethyloxetane, (3-ethyl-3-oxetanylmethoxy)methylbenzen, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3 ethyl 3 oxetanylmethyl)ether, 2-ethylhexyl(3-ethyl-3-oxetanylmethyl)ether, ethyldiethylene glycol(3-ethyl-3-oxetanylmethyl)ether, dicyclopentadiene(3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanyl methyl)ether, 2-hydroxypropyl(3 ethyl 3 oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, bornyl(3-ethyl-3-oxetanylmethyl)ether, and the like. These compounds can be used either individually or in combination of two or more.

Examples of compounds having two or more oxetane rings in the molecule are 3,7-bis(3-oxetanyl)-5-oxa-nonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methy]propane, ethylene glycol bis(3-ethyl-3-oxetanylmethyl)ether, dicyclopentenyl bis(3-ethyl-3oxetanylmethyl)ether, triethylene glycol bis(3-ethyl-3oxetanylmethyl)ether, tetraethylene glycol bis(3-ethyl-3-oxetanylmethyl)ether, tricyclodecanediyldimethylene(3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3 ethyl 3 oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl)ether, PO-modified bisphenol A bis (3-ethyl-3-oxetanylmethyl)ether, EO-modified hydrogenated bisphenol A bis(3-ethyl-3-oxetanylmethyl) ether, PO-modified hydrogenated bisphenol A bis(3-ethyl-3-oxetanylmethyl)ether, EO-modified bisphenol F (3-ethyl-3-oxetanylmethyl)ether, and the like. These compounds can be used either individually or in combination of two or more.

Of the above compounds, oxetane compounds having 1-10, preferably 1-4, and particularly preferably two oxetane rings in the molecule are suitable. Specifically, (3-ethyl-3-oxetanylmethoxy)methylbenzene, 1,4-bis[(3-ethyl-3-oxetanylmethoxy)methyl]benzene, 1,2-bis(3-ethyl-3-oxetanylmethoxy)ethane and trimethylolpropane tris(3-ethyl-3-oxetanylmethyl)ether are used. These compounds can be used either individually or in combination of two or more.

The present composition comprises, relative to the total weight of the composition, 5 wt % to 80 wt % of one or more oxetanes. It can also comprise 10 wt % to 60 wt % of one or more oxetanes, relative to the total weight of the composition.

Hydroxy-Functional Compounds

The present compositions may comprise suitable polymerizable hydroxy-functional compounds.

The hydroxyl-containing material used in the present invention can be any suitable organic material having a hydroxyl functionality of at least 1, and preferably at least 2. The material is preferably substantially free of any groups which interfere with the curing reactions or which are thermally or photolytically unstable. These compounds can be used either individually or in combination of two or more.

Any hydroxy group may be employed for the particular purpose. Preferably the hydroxyl-containing material contains two or more primary or secondary aliphatic hydroxyls. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000. These compounds can be are used either individually or in combination of two or more.

Representative examples of hydroxyl-containing materials having a hydroxyl functionality of 1 include alkanols, monoalkyl ethers of polyoxyalkyleneglycols, monoalkyl ethers of alkyleneglycols, and others, and combinations thereof.

Representative examples of useful monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(–)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of useful oligomeric and polymeric hydroxyl-containing materials include polyoxyethylene and polyoxypropylene glycols and triols of molecular weights from about 200 to about 10,000; polytetramethylene glycols of varying molecular weight; poly(oxyethylene-oxybutylene) random or block copolymers; copolymers containing pendant hydroxy groups formed by hydrolysis or partial hydrolysis of vinyl acetate copolymers, polyvinylacetals containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

Other hydroxyl-containing monomers include 1,4-cyclohexanedimethanol and aliphatic and cycloaliphatic monohydroxy alkanols. Other hydroxyl-containing oligomers and polymers include hydroxyl and hydroxyl/epoxy functionalized polybutadiene, polycaprolactone diols and triols, ethylene/butylene polyols, and monohydroxyl functional monomers. Examples of polyether polyols are polypropylene glycols of various molecular weights and glycerol propoxylate-B-ethoxylate triol. Additional examples include linear and branched polytetrahydrofuran polyether polyols available in various molecular weights, such as in the range of 150-4000 g/mol, preferably in the range of 150-1500 g/mol, more preferably in the range of 150-750 g/mol.

The present composition comprises, relative to the total weight of the composition, 1 wt % to 60 wt % of one or more polymerizable hydroxy-functional compounds. It can also comprise 5 wt % to 40 wt % of one or more polymerizable hydroxy-functional compounds, relative to the total weight of the composition. It can further comprise 10 wt % to 25 wt % of one or more polymerizable hydroxy-functional compounds, relative to the total weight of the composition.

(Meth)acrylates

A component that can be used in a composition of the present invention can be a (co)polymer obtainable by (co) polymerizing a monomer comprising at least one (meth)acrylate group or a mixture of monomers comprising at least one monomer comprising a (meth)acrylate group. Specifically, the component may be one or more of (co)polymers selected from (1) a homopolymer of a (meth)acrylate group containing monomer, (2) a copolymer made from two or more (meth) acrylates group containing monomers, and (3) a copolymer made from one or more (meth)acrylates group containing monomers and one or more other monomers copolymerizable with the (meth)acrylate group containing monomer.

Given as examples of suitable (meth)acrylic esters are n-propyl(meth)acrylate, n-butyl (meth)acrylate, i-butyl (meth)acrylate, sec-butyl(meth)acrylate, tert-butyl (meth) acrylate, n-aminohexyl(meth)acrylate, 2-heptyl(meth)acrylate, octyl(meth)acrylate, 2-ethylhexyl(meth)acrylate, nonyl (meth)acrylate, decyl(meth)acrylate, dodecyl (meth)acrylate, hexadecyl(meth)acrylate, octadecyl(meth)acrylate, cyclohexyl (meth)acrylate, and phenyl(meth)acrylate. Although these (meth)acrylic acid esters may be used individually, combined use of two or more of them is more also suitable.

As monomers (copolymerizable monomers) other than (meth)acrylic acid esters for preparing the copolymer, vinyl compounds such as, for example, vinyl acetate, styrene, vinyl chloride, vinylidene chloride, acrylonitrile, vinyl toluene and acrylamide can be given.

Ethylenically unsaturated monomers can be used as a component in the composition of the present invention is a compound having an ethylenically unsaturated bond (C double bonded to another C) in the molecule, and includes monofunctional monomers containing one ethylenically unsaturated bond in one molecule and polyfunctional monomers containing two or more, and preferably three or more ethylenically unsaturated bonds in one molecule.

Examples of monofunctional monomers having one ethylenically unsaturated bond in the molecule include acrylamide, (meth)acryloylmorpholine, 7-amino-3,7-dimethyloctyl (meth)acrylate, isobutoxymethyl(meth)acrylamide, isobornyloxyethyl(meth)acrylate, isobornyl(meth)acrylate, 2-ethylhexyl(meth)acrylate, ethyldiethylene glycol (meth) acrylate, t-octyl(meth)acrylamide, diacetone (meth)acrylamide, dimethylaminoethyl(meth)acrylate, diethylaminoethyl (meth)acrylate, lauryl(meth)acrylate, dicyclopentadiene (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxyethyl (meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl (meth)acrylate, 2-hydroxypropyl (meth)acrylate, vinylcaprolactam, N-vinylpyrrolidone, phenoxyethyl(meth)acrylate, butoxyethyl(meth)acrylate, pentachlorophenyl(meth)acrylate, pentabromophenyl(meth) acrylate, polyethylene glycol mono(meth)acrylate, polypropylene glycol mono(meth)acrylate, bornyl(meth)acrylate and methyltriethylene diglycol (meth)acrylate, and compounds shown by the following formulas (28)-(30). These compounds may be used either individually or in combination of two or more.

As examples of commercially available products of these monofunctional monomers, ARONIX M-101, M-102, M-111, M-113, M-117, M-152, TO-1210 (manufactured by Toagosei Co., Ltd.), KAYARAD TC-110S, R-564, R-128H (manufactured by Nippon Kayaku Co., Ltd.), Viscoat 192, 220, 2311HP, 2000, 2100, 2150, 8F, 17F (manufactured by Osaka Organic Chemical Industry Co., Ltd.), and the like can be listed.

Examples of the polyfunctional monomers having two or more ethylenically unsaturated bonds in one molecule include ethylene glycol di(meth)acrylate, dicyclopentenyl di(meth)acrylate, triethylene glycol diacrylate, tetraethylene glycol di(meth)acrylate, tricyclodecanediyldimethylene di(meth)acrylate, tris(2-hydroxyethyl)isocyanurate di(meth) acrylate, tris(2-hydroxyethyl)isocyanurate tri(meth)acrylate, caprolactone-modified tris(2-hydroxyethyl)isocyanurate tri (meth)acrylate, trimethylolpropane tri(meth)acrylate, EO-modified trimethylolpropane tri(meth)acrylate, PO-modified trimethylolpropane tri(meth)acrylate, tripropylene glycol di(meth)acrylate, neopentyl glycol di(meth)acrylate, both terminal (meth)acrylate adduct of bisphenol A diglycidyl ether, 1,4-butanediol di(meth)acrylate, 1,6-hexanediol di(meth)acrylate, pentaerythritol tri(meth) acrylate, pentaerythritol tetra(meth)acrylate, polyester di(meth)acrylate, polyethylene glycol di(meth)acrylate, dipentaerythritol hexa(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropane tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, EO-modified bisphenol F di(meth)acrylate, (meth)acrylate of phenol novolak polyglycidyl ether, and the like. These compounds can be used either individually or in combination of two or more.

As examples of commercially available products of these polyfunctional monomers, SA 1002 (manufactured by Mitsubishi Chemical Corp.), Viscoat 195, 230, 260, 215, 310, 214HP, 295, 300, 360, GPT, 400, 700, 540, 3000, 3700 (manufactured by Osaka Organic Chemical Industry Co., Ltd.), KAYARAD R-526, HDDA, NPGDA, TPGDA, MANDA, R-551, R-712, R-604, R-684, PET-30, GPO-303, TMPTA, THE-330, DPHA, DPHA-2H, DPHA-2C, DPHA-21, D-310, D-330, DPCA-20, DPCA-30, DPCA-60, DPCA-120, DN-0075, DN-2475, T-1420, T-2020, T-2040, TPA-320, TPA-330, RP-1040, RP-2040, R-011, R-300, R-205 (manufactured by Nippon Kayaku (Co., Ltd.), ARONIX M-210, M-220, M-233, M-240, M-215, M-305, M-309, M-310, M-315, M-325, M-400, M-6200, M-6400 (manufactured by Toagosei Co., Ltd.), Lite Acrylate BP-4EA, BP-4PA, BP-2EA, BP-2PA, DCP-A (manufactured by Kyoeisha Chemical Co., Ltd.), New Frontier BPE-4, TEICA, BR-42M, GX-8345 (manufactured by Daiichi Kogyo Seiyaku Co., Ltd.), ASF-400 (manufactured by Nippon Steel Chemical Co., Ltd.), Ripoxy SP-1506, SP-1507, SP-1509, VR-77, SP-4010, SP-4060 (manufactured by Showe Highpolymer Co., Ltd.), NK Eater A-BPE-4 (manufactured by Shin-Nakamura Chemical Co., Ltd.), and the like can be given.

These polyfunctional monomers having three or more ethylenically unsaturated bonds can be selected from the group consisting of the above-mentioned tri(meth)acrylate compounds, tetra(meth)acrylate compounds, penta(meth)acrylate compounds, and hexa(meth)acrylate compounds. Of these, trimethylolpropane tri(meth)acrylate, EO-modified trimethylolpropane tri(meth)acrylate, dipentaerythritol hexa (meth)acrylate, dipentaerythritol penta(meth)acrylate, and ditrimethylolpropane tetra(meth)acrylate are particularly preferable. These compounds can be used either individually or in combination of two or more.

The present composition comprise, relative to the total weight of the composition, 0 wt % to 50 wt % of one or more (meth)acrylates. It can also comprise 6 wt % to 40 wt % of one or more (meth)acrylates.

Cationic Photoinitiators

In the compositions according to the invention, any suitable type of photoinitiator that, upon exposure to actinic radiation, forms cations that initiate the reactions of the cationically polymerizable compounds, such as epoxy material(s), can be used. There are a large number of known and technically proven cationic photoinitiators that are suitable. They include, for example, onium salts with anions of weak nucleophilicity. Examples are halonium salts, iodosyl salts or sulfonium salts, such as are described in published European patent application EP 153904 and WO 98/28663, sulfoxonium salts, such as described, for example, in published European patent applications EP 35969, 44274, 54509, and 164314, or diazonium salts, such as described, for example, in U.S. Pat. Nos. 3,708,296 and 5,002,856. All eight of these disclosures are hereby incorporated in their entirety by reference. Other cationic photoinitiators are metallocene salts, such as described, for example, in published European applications EP 94914 and 94915, which applications are both hereby incorporated in their entirety by reference.

A survey of other current onium salt initiators and/or metallocene salts can be found in "UV Curing, Science and Technology" (Editor S. P. Pappas, Technology Marketing Corp., 642 Westover Road, Stamford, Conn., U.S.A.) or "Chemistry & Technology of UV & EB Formulation for Coatings, Inks & Paints (Volume 3)" (edited by P. K. T. Oldring), and both books are hereby incorporated in their entirety by reference.

Preferred cationic photoinitiators include iodonium photoinitiators, e.g. iodonium tetrakis (pentafluorophenyl) borate, because they tend to be less yellowing, especially when used in combination with photosensitizers. Other suitable iodonium initiators are detailed in WO 2005/070989, which is hereby incorporated in its entirety by reference.

The present composition can comprise, relative to the total weight of the composition, 0.1 wt %-15 wt % of one or more cationic photoinitiators, preferably 0.3 wt %-10 wt % for sulfonium type initiator/solvent cationic initiators. In the case composition comprising iodonium cationic initiators, approximately 0.1 wt % to 5 wt % of active initiator is used by weight and preferably from 0.25 wt % to 3 wt % is used.

Sensitizers

In order to increase the light efficiency, or to sensitize the cationic photoinitiator to specific wavelengths, such as for example specific laser wavelengths or a specific series of laser wavelengths, it is also possible, depending on the type of initiator, to use sensitizers. Examples of sensitizers are polycyclic aromatic hydrocarbons or aromatic keto compounds. Specific examples of preferred sensitizers are mentioned in published European patent application EP 153904, which is hereby incorporated in its entirety by reference. Other preferred sensitizers are benzoperylene, 1,8-diphenyl-1,3,5,7-octatetraene, and 1,6-diphenyl-1,3,5-hexatriene as described in U.S. Pat. No. 5,667,937, which is hereby incorporated in its entirety by reference. It will be recognized that an additional factor in the choice of sensitizer is the nature and primary wavelength of the source of actinic radiation. Other preferred photosensitizers are isopropylthioxanthone, chlorothioxanthone, and other substituted thioxanthones, as well as 4-Benzoyl-4'-methyldiphenyl sulfide. 4-Benzoyl-4'-methyldiphenyl sulfide (BMS) is most preferred for use in sterolithography due to low color formation and low aborption below 400 nm. Other suitable sensitizers are detailed in WO 2005/070989, which is hereby incorporated in its entirety by reference.

The concentration of a photosensitizer in a formulation is dependent upon many other factors such as the presence of: other absorbing species, for example photoinitiators, monomers, and dyes, etc.; the presence of light scattering components; the wavelength of use in the system; the depth of polymerization to be achieved; the solvent polarity; the degree and type of substitution on the photosensitizer moiety; the bleaching or shading as a result of absorber cleavage or addition; and so on. In general it is preferable to have a photosensitizer concentration that makes the depth of penetration (commonly referred to in the stereolithographic art as $D_p$) to be on the order of the thickness of a layer of composition that is applied to a surface, or the depth to which polymerization is to be achieved by an actinic exposure. Preferably, the photosensitizer is employed in the compositions of this invention to achieve a $D_p$ of between about 0.005 to about 0.03 cm. For example, if a coated layer is approximately 0.015 cm thick, the Dp of the composition is preferably on the order of 0.005-0.025 cm. To achieve the preferred Dp range of approximately 0.005 to 0.03 cm utilizing 4-Benzoyl-4'-methyldiphenyl sulfide (BMS) in a clear non-absorbing monomer, absent other initiators, absorbers, or light scattering elements, in the working wavelength ranges of, for example 313-365 nm, a concentration of between 0.12 wt % to 0.85 wt % is preferably used. If however other absorbers, initiators, light scattering components, etc. were present, lower concentrations would preferably be used. Such concentrations might be as low as about 0.01 wt % to about 0.8 wt %. Overall the photosensitizer is employed within a range of between about 0.01 wt % to about 1.0 wt % by weight of the unfilled (i.e. lacking fillers, such as for example glass) composition.

In the instant invention, it is preferable to use a photosensitizer and other initiators such that the Dp is less than the thickness of a coated layer or in the lower preferred range of Dp. A lower Dp (higher absorption) causes the actinic light to be absorbed closer to the surface of the exposed photopolymer and therefore leads to a diminished "activated" volume (roughly the depth of exposure times the exposed photopolymer surface) and in turn less polymerization exotherm. In addition, heat generated as a result of the exotherm at the surface is more likely to be lost to the surroundings rather than to the unexposed portions of the composition.

Free Radical Photoinitiators

The compositions may employ a photoinitiator that forms free radicals when the appropriate irradiation takes place can be used. Typical compounds of known photoinitiators are benzoins, such as benzoin, benzoin ethers, such as benzoin methyl ether, benzoin ethyl ether, and benzoin isopropyl ether, benzoin phenyl ether, and benzoin acetate, acetophenones, such as acetophenone, 2,2-dimethoxyacetophenone, 4-(phenylthio)acetophenone, and 1,1-dichloroacetophenone, benzil, benzil ketals, such as benzil dimethyl ketal, and benzyl diethyl ketal, anthraquinones, such as 2-methylanthraquinone, 2-ethylanthraquinone, 2-tertbutylanthraquinone, 1-chloroanthraquinone, and 2-amylanthraquinone, also triphenylphosphine, benzoylphosphine oxides, such as, for example, 2,4,6-trimethyl-benzoyldiphenylphosphine oxide (Lucirin TPO), benzophenones, such as benzophenone, and 4,4'-bis(N,N'-dimethylamino)benzophenone, thioxanthones and xanthones, acridine derivatives, phenazene derivatives, quinoxaline derivatives or 1-phenyl-1,2-propanedione-2-O-benzoyloxime, 1-aminophenyl ketones or 1-hydroxyphenyl ketones, such as 1-hydroxycyclohexyl phenyl ketone, phenyl (1-hydroxyisopropyl)ketone and 4-isopropylphenyl(1-hydroxyisopropyl)ketone, or triazine compounds, for example, 4'''-methyl thiophenyl-1-di(trichloromethyl)-3,5-S-triazine, S-triazine-2-(stilbene)-4,6-bistrichloromethyl, and paramethoxy styryl triazine, all of which are known compounds. These compounds can be used either individually or in combination of two or more.

Suitable free-radical photoinitiators, which are normally used in combination with a He/Cd laser, operating at for example 325 nm, an Argon-ion laser, operating at for example 351 nm, or 351 and 364 nm, or 333, 351, and 364 nm, or a frequency tripled YAG solid state laser, having an output of 349 or 355 nm, as the radiation source, are acetophenones, such as 2,2-dialkoxybenzophenones and 1-hydroxyphenyl ketones, for example 1-hydroxycyclohexyl phenyl ketone, 2-hydroxy-1-{4-(2-hydroxyethoxy)phenyl}-2-methyl-1-propanone, or 2-hydroxyisopropyl phenyl ketone (also called 2-hydroxy-2,2-dimethylacetophenone), but especially 1-hydroxycyclohexyl phenyl ketone. Another class of free-radical photoinitiators comprises the benzil ketals, such as, for example, benzil dimethyl ketal. Especially an alpha-hydroxyphenyl ketone, benzil dimethyl ketal, or 2,4,6-trimethylbenzoyldiphenylphosphine oxide may be used as photoinitiator. These compounds can be are used either individually or in combination of two or more.

Another class of suitable free radical photoinitiators comprises the ionic dye-counter ion compounds, which are capable of absorbing actinic rays and producing free radicals, which can initiate the polymerization of the acrylates. The compositions according to the invention that comprise ionic dye-counter ion compounds can thus be cured in a more variable manner using visible light in an adjustable wavelength range of 400 to 700 nanometers. Ionic dye-counter ion compounds and their mode of action are known, for example from published European patent application EP 223587 and U.S. Pat. Nos. 4,751,102, 4,772,530 and 4,772,541.

Other free radical photoinitiators include 1-hydroxycyclohexyl phenyl ketone, 2-hydroxy-2-methyl-1-phenylpropan-1-one, 2,2-dimethoxyacetophenone, and 2,4,6-trimethylbenzoyldiphenylphosphine oxide. These photoinitiators tend to be comparatively less yellowing.

In the case of the instant invention, which comprises iodonium-based cationic photoinitiators, 2-Hydroxy-2-2 methyl-1-phenyl-propan-1-one (Chivacure 173) and 1-hydroxycyclohexyl phenyl ketone are preferred as co-sensitizers with other photosensitizers such as for example ITX and BMS. 2-Hydroxy-2-2 methyl-1-phenyl-propan-1-one is most preferred in this regard for applications utilizing wavelengths below 365 nm for the actinic exposure.

The present composition can comprise, relative to the total weight of the composition, 0.1 wt %-15 wt % of one or more free radical photoinitiators, more preferably 1 wt %-10 wt %.

Antioxidants

Examples of the phenol antioxidants to be used in the present invention include 2,6-di-tert-butyl-p-cresol, stearyl (3,5-dimethyl-4-hydroxybenzyl)-thioglycolate, stearyl .beta.-(4-hydroxy-3,5-di-tert-butylphenol)propionate, 2,4,6-tris(3',5'-di-tert-butyl-4'-hydrohybenzylthio)1,3,5-triazine, distearyl (4-hydroxy-3-methyl-5-tert-butyl)benzylmalonate, 2,2'-methylenebis(4-methyl-6-tert-butylphenol), 4,4'-methylenebis(2,6-di-tert-butylphenol), 2,2'-methylenebis[6-(1-methylcyclohexyl)-p-cresol], bis[3,5-bis(4-hydroxy-3-tert-butylphenyl)butyric acid]glycol ester, 4,4'-butylidenebis(6-tert-butyl-m-cresol), 2,2'-ethylidenebis(4,6-di-tert-butylphenol), 2,2'-ethylidenebis(4-sec-butyl-6-tert-butylphenol), 1,1,3-tris(2-methyl-4-hydroxy-5-tert-butylphenyl)-butane, bis[2-tert-butyl-4-methyl-6-(2- hydroxy-3-tert-butyl-5-methylbenzyl)phenyl]terephthalate, 1,3,5-tris(3,5-di-tert-butyl-4-hydroxybenzyl)-2,4,6-trimethylbenzene, 2,6-diphenyl-4-octadecyloxyphenol, tetrakis[methylene-3-(3,5-di-tert-butyl-4-hydroxyphenyl) propionate] methane, 2-octylthio-4,6-di(4-hydroxy-3,5-di-tert-butyl) phenoxy-1,3,5-triazine, 4,4'-thiobis(6-tert-butyl-m-cresol), stearyl .beta.-(3-t-butyl-4-hydroxy-5-methylphenyl)-propionate, and triethylene glycol bis[.beta.-(3-t-butyl-4-hydroxy-5-methylphenyl)propionate]. Preferred are phenol antioxidants known as butylated hydroxyl toluene, propyl gallate, tertiary butyl hydroquinone, butylated hydroxyl anisole, 4,4í (2,3 dimethyl tetramethylene dipyrochatechol), alpha tocopherol, Thiodiethylene bis-(3,5-di-tert-butyl-4-hydroxy)hydrocinnamate, and, Tetrakis(methylene-3(3',5'-de-t-butyl-4'hydroxyphenyl)propionate)methane.

Although the amount of phenol antioxidant used in an iodonium-based composition depends on the molecular weight and number of phenol groups, in general from 0.01 wt % to 2 wt % of the phenol antioxidant is used, relative to the total weight of the composition. 0.02 wt % to 0.3 wt % of phenol antioxidant can be used in order to maintain fair to excellent greenstrength in an iodonium based composition.

Examples of lactone antioxidants are 5,7-di-t-butyl-3-(3, 4-dimethylphenyl)-3H-benzofuran-2-one, 2(3H)-benzofuranone, 5,7-bis(1,1-dimethylethyl)-3-hydroxy RX (O)xylene, and other 2-phenylbenzofuran-2-one lactones.

In general approximately 0.01 wt % to 2 wt % of the lactone antioxidant is used in the iodonium-based composition, preferably 0.02 wt % to 1 wt %, more preferably 0.03 wt % to 0.7 wt % of the lactone antioxidant, relative to the total weight of the composition. If lactone antioxidants are used in combination with phenol antioxidants, it is preferred to use the antioxidants in the lower ranges of their respective preferred amounts.

Additives

Additives may also be present in the composition of the invention. Acid scavenging stabilizers are often added to the compositions in order to prevent a viscosity build-up, for instance a viscosity build-up during usage in a solid imaging process. Preferred acid scavenging stabilizers include those described in U.S. Pat. No. 5,665,792, the entire disclosure of which is hereby incorporated by reference. Such acid scavenging stabilizers are usually hydrocarbon carboxylic acid salts of group IA and IIA metals. Preferred examples of these salts are sodium bicarbonate, potassium bicarbonate, and rubidium carbonate. Rubidium carbonate is preferred for formulations of this invention with recommended amounts varying between 0.0015 to 0.005% by weight of composition. Alternative acid scavenging stabilizers are polyvinylpyrrolidones and polyacrylonitriles. Other possible additives include dyes, pigments, fillers (e.g. silica particles—preferably amorphous silica particles—, glass beads, or talc), wetting agents, photosensitizers for the free-radical photoinitiator, leveling agents, surfactants and the like.

The curing radiation is preferably in the range of 280-650 nm. Any convenient source of actinic radiation can be used, but lasers are particularly suitable. Useful lasers, in the field of stereolithography, include HeCd, argon, and frequency tripled NdYAG lasers. The exposure energy is preferably in the range of 10-150 mJ/cm$^2$.

EXAMPLES

In the examples, the petri-dishes used were a polystyrene 60×15 mm style trade-named Falcon® 351007 and manufactured by Becton Dickinson. In some cases, the petri-dishes were filled with 15 grams of formulation and in other cases 20 grams of solution were used. The density of the resin is in the order of 1.13 g/l. In the case of the petri-dishes, the coating thickness (or depth) for a 15 gram sample was approximately 0.47 cm and the coating thickness (or depth) for the 20 gram sample was approximately 0.63 cm.

In the following examples, representative components used in the example compositions were:

| | | |
|---|---|---|
| Epon 825 | Diepoxide | Bisphenol A diglycidyl ether |
| UVR-6105 | Diepoxide | 3,4-Epoxy Cyclohexyl Methyl-3,4-Epoxy Cyclohexyl Carboxylate |
| Grilonit F713 | Diepoxide | Polytetrahydrofuran Diglycidyl Ether |
| Rhodorsil 2074 | Cationic initiator | (tolylcumyl) iodonium tetrakis (pentafluorophenyl) borate |
| OXT-101 | Oxetane | 3-Ethyl-3-(hydroxymethyl)oxetane |
| Chivacure BMS | Sensitizer | Benzoyl-4'-methyldiphenyl sulfide |
| ITX | Sensitizer | Isopropyl Thioxanthone |
| Chivacure 173 | Initiator/Sensitizer | 2-Hydroxy-2-2 methyl-1-phenyl-propan-1-one |
| DPHA | Polyacrylate | Dipentaerythritol Hexacrylate |
| Vikolox 14 | Monoepoxide | 1,2 Tetradecane Oxide |
| PolyFox 6520 | Fluorinated Surfactant. | See estimated structure below. FIG. 1 |
| BYK-361-N | Leveling Agent | Acrylate copolymer surfactant |
| PVP | Cationic Stabilizer | polyvinylpyrrolidone |
| IR-1035 | Antioxidant | Thiodiethylene bis-(3,5-di-tert-butyl-4-hydroxy)hydrocinnamate |
| IR-1010 | Antioxidant | Tetrakis(methylene-3(3',5'-de-t-butyl-4'hydroxyphenyl)propionate)Methane |
| Longnox 10 | Antioxidant | Tetrakis(methylene-3(3',5'-de-t-butyl-4'hydroxyphenyl)propionate)Methane |
| HP-136 | Antioxidant | 2(3H)-benzofuranone, 5,7-bis(1,1-dimethylethyl)-3-hydroxy RX (o)xylene |
| BHT | Antioxidant | 2,6-di-tert-butyl-p-cresol |
| Propyl Gallate | Antioxidant | Propyl Gallate |

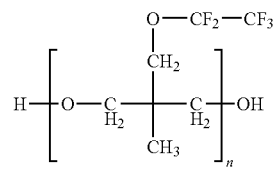

FIG. 1 n = 20

Epon 825 was obtained from Resolution Performance Co., Houston Tex. UVR 6105 was obtained form Dow, Danbury Conn. Grilonit F713 was obtained from EMS-Chemie, Sumter, S.C. Rhodorsil 2074 was obtained from Rhodia Silicones S.A.S, Lyon, France. OXT-101 was obtained from To a Gosei of Japan. Chivacure BMS and Chivacure 173 were obtained from Chitec Chemical Co., Ltd., Taiwan. ITX or isopropyl thioxanthone, PVP, BHT, and Propyl Gallate were obtained from Aldrich of Milwaukee, Wis. DPHA was obtained from Sartomer, Exton, Pa. Vikolox 14 was obtained from Elf Atochem, Philadelphia Pa. PolyFox 6520 was obtained from Omnova Solutions, Akron, Ohio. BYK-361-N was obtained from BYK-Chemie, Wallingford, Conn. IR-1035, IR-1010 and HP-136 were obtained from Ciba Specialty Chemicals Corporation, Tarrytown, N.Y. BHT was obtained as lonol® from Degussa Fine Chemicals, Parsippany, N.J. Longnox 10 was obtained from Longchem International, Taipei, Taiwan.

Preparation of the Compositions:

The comparative Examples and Examples in Tables 1 and 2 were prepared by mixing the ingredients used in each composition until all ingredients were dissolved. These examples are representative of photoimageable compositions useful in, for example, stereolithography processes.

Test Methods:

Exposure Stability Test:

The Exposure Stability Test is used to evaluate the reduction of the run-away reaction when phenol and/or lactone antioxidants are used. In the Exposure Stability Tests for Comparative Example 1 and Examples 1-12, a base composition was prepared and the detailed amount of antioxidant was added to this base composition and dissolved to a uniform Example solution. Then the Example solution was weighed out into the petri-dishes. Each petri-dish of solution was exposed in a PCA (using 10 Phillips TLK 40 W/05 fluorescent bulbs having between 120 and 190 hours of usage) for approximately 10 minutes. The samples were placed on a crown glass plate.

For the Table I, Comparative Example 1 and Examples 1-12, a rating of "Fail" indicates that the formulation turned brown or began to blacken and smoke within the 10-minute exposure period. A rating of "Pass" means that the formulation sample did not turn brown, blacken, or smoke within the 10-minute exposure period.

From the experiments, it is apparent that the addition of phenol or/and lactone antioxidant helps reduce the run-away polymerization reaction when exposed in-bulk to actinic flood exposure. It is also noticed that increasing the amount of phenol or lactone antioxidant eventually allows the sample to pass the petri-dish tests. In addition, it is apparent that combinations of both the phenol and the lactone antioxidants are useful for reducing run-away polymerizations when exposed in-bulk to actinic flood exposure. It is possible that even a formulation passes the 15-gram petri-dish sample test, it may fail the 20-gram petri-dish test.

Exposed Strip Green Strength Test:

The Exposed Strip Green Strength judgments were obtained by first pouring composition into a petri-dish and then scanning a rectangular strip approximately 12.2 by 76.2 mm on the surface using a Solid State laser operating in the UV at ~355 nm. The $1/e^2$ spot diameter of the focused beam was approximately 0.22 mm and scanning lines parallel to the strip length generated the image. The distance between scan lines was approximately 0.051 mm apart and the total exposure was approximately 35 mJ/cm² for all strips. The judgment of the green strength was made by impressing a metal spatula into the surface of the strip. A "Poor" green strength strip would be easily deformed by the spatula, and would be somewhat friable or easily broken when the spatula is impressed and moved sideways. This is a typical condition in formulations where the free-radical/acrylate polymerization of the exposed strip has proceeded but the cationic polymerization has been inhibited or slowed. A "Fair" green strength strip is still fairly soft but would have more integrity when the spatula is impressed and moved sideways. That is, the strip would not be easily friable but could still be torn with mild effort. Such a condition is an indication that the cationic polymerization has proceeded to a point that the strip has moderate integrity. A "Good" green strength strip is moderately soft and requires some effort to tear, for example, several scrapes of the surface. An "Excellent" green strength strip is stiff, and may actually click when tapped by the spatula. Significant effort is required to tear the strip that is usually more prone to cracking rather than tearing. Although green strip performance varies formulation to formulation, in general it is preferred that the green strength be greater than poor. However, if improved stability is desired, a compromise between improved stability and green strength, in such a case "Fair" to "Good" green strength with "Pass" exposure stability is most preferred.

Photospeed Measurement:

The following procedure and formulation was used in a stereolithography process in order to obtain the Photospeed. The photospeed of the composition was measured by performing the following steps:

1. A petri dish of composition was placed in the image plane within a stereolithography chamber that had a temperature of approximately 30° C. and relative humidity of approximately 30%.
2. The surface of the composition was exposed to a series of six exposures, where each exposure was a square approximately 1.27 cm on a side. The six exposures were approximately 31.9, 40, 47.5, 59, 79, and 94.5 mJ/cm². The exposures were made with a frequency tripled Solid State laser beam having an approximate wavelength output of 354.7 nm and power of 115 mW at the image plane. The beam was focused to approximately 0.022 cm at the image plane and the laser had a pulse frequency of 80 kHz. Each exposure was conducted in a line-by-line manner with the beam scanned in the Y-direction and then advanced in the X direction in 0.0051 cm increments.
3. After 15 minutes, the squares were removed from the petri dish and blotted with a paper towel. The thickness of each square was measured utilizing Mitutoyo Model NTD12-8#C digital spring loaded calipers.
4. A least squares fit line of the natural-log-of-exposure vs. thickness-measured gave the Photospeed values listed. Such a characterization is standard in the stereolithographic art where the Ec is the minimum energy to theoretically convert monomer to polymer, E10 is the actinic exposure energy necessary to form a 10 mil (0.254 mm) thickness, and Dp is the slope of the least squares fit line of the working curve.
5. In cases where the photospeed was relatively slow (i.e. the E10 value was high) higher laser power was provided such that the average exposure yielded a strip thickness of approximately 0.254 mm thickness.

TABLE I

| | Comp. 1 | Ex. 1 | Ex. 2 | Ex. 3 | Ex. 4 |
|---|---|---|---|---|---|
| Base Composition | | | | | |
| Epon 825 | 54.863 | 54.863 | 54.863 | 54.863 | 54.863 |
| UVR-6105 | 10.000 | 10.000 | 10.000 | 10.000 | 10.000 |
| Grilonit F713 | | | | | |
| Rhodorsil 2074 | 0.500 | 0.500 | 0.500 | 0.500 | 0.500 |
| OXT-101 | 18.000 | 18.000 | 18.000 | 18.000 | 18.000 |
| Chivacure BMS Isopropyl Thioxanthone | 0.130 | 0.130 | 0.130 | 0.130 | 0.130 |
| Chivacure 173 | 4.500 | 4.500 | 4.500 | 4.500 | 4.500 |
| DPHA | 6.000 | 6.000 | 6.000 | 6.000 | 6.000 |
| Vikolox 14 | 5.000 | 5.000 | 5.000 | 5.000 | 5.000 |
| Polyfox 6520 | 0.0020 | 0.0020 | 0.0020 | 0.0020 | 0.0020 |
| Byk 361-N | 1.0000 | 1.0000 | 1.0000 | 1.0000 | 1.0000 |
| PVP | 0.005 | 0.005 | 0.005 | 0.005 | 0.005 |

TABLE I-continued

| Stabilizer Additive | | | | | |
|---|---|---|---|---|---|
| IR-1035 | | | | | |
| IR-1010 | | | | | |
| HP-136 | | | | | 0.1 |
| BHT | | 0.1 | 0.05 | 0.02 | |
| Propyl Gallate | | | | | |
| Exposed Strip Green Strength | Excellent | Poor | Good | Excellent | Poor |
| Photospeed | | | | | |
| E10 (mJ/cm$^2$) | | | 33.97 | 29.21 | |
| Dp (mm) | | | 0.31 | 0.33 | |
| Exposure Stability Test | | | | | |
| 20 gm petri-dish PCA | Fail | Pass | Pass | Pass | |
| 15 gm petri-dish PCA | Fail | | | | Pass |

|  | Ex. 5 | Ex. 6 | Ex. 7 | Ex. 8 |
|---|---|---|---|---|
| Base Composition | | | | |
| Epon 825 | 54.863 | 54.863 | 54.863 | 54.863 |
| UVR-6105 | 10.000 | 10.000 | 10.000 | 10.000 |
| Grilonit F713 | | | | |
| Rhodorsil 2074 | 0.500 | 0.500 | 0.500 | 0.500 |
| OXT-101 | 18.000 | 18.000 | 18.000 | 18.000 |
| Chivacure BMS | 0.130 | 0.130 | 0.130 | 0.130 |
| Isopropyl Thioxanthone | | | | |
| Chivacure 173 | 4.500 | 4.500 | 4.500 | 4.500 |
| DPHA | 6.000 | 6.000 | 6.000 | 6.000 |
| Vikolox 14 | 5.000 | 5.000 | 5.000 | 5.000 |
| Polyfox 6520 | 0.0020 | 0.0020 | 0.0020 | 0.0020 |
| Byk 361-N | 1.0000 | 1.0000 | 1.0000 | 1.0000 |
| PVP | 0.005 | 0.005 | 0.005 | 0.005 |
| Stabilizer Additive | | | | |
| IR-1035 | | | | 0.05 |
| IR-1010 | | 0.3 | 0.1 | |
| HP-136 | 0.05 | | | 0.05 |
| BHT | | | | |
| Propyl Gallate | | | | |
| Exposed Strip Green Strength | Excellent | Fair | Excellent | Excellent |
| Photospeed | | | | |
| E10 (mJ/cm$^2$) | 27.3 | 29.08 | 26.03 | 27.23 |
| Dp (mm) | 0.30 | 0.30 | 0.29 | 0.29 |
| Exposure Stability Test | | | | |
| 20 gm petri-dish PCA | Pass | Pass | Pass | Pass |
| 15 gm petri-dish PCA | Pass | | | |

|  | Ex. 9 | Ex. 10 | Ex. 11 | Ex. 12 |
|---|---|---|---|---|
| Base Composition | | | | |
| Epon 825 | 54.863 | 53.738 | 53.763 | 54.863 |
| UVR-6105 | 10.000 | 10.000 | 10.000 | 10.000 |
| Grilonit F713 | | | | |
| Rhodorsil 2074 | 0.500 | 1.000 | 1.000 | 0.500 |
| OXT-101 | 18.000 | 18.000 | 18.000 | 18.000 |
| Chivacure BMS | 0.130 | 0.160 | 0.160 | 0.130 |
| Isopropyl Thioxanthone | | | | |
| Chivacure 173 | 4.500 | 5.000 | 5.000 | 4.500 |
| DPHA | 6.000 | 6.000 | 6.000 | 6.000 |
| Vikolox 14 | 5.000 | 5.000 | 5.000 | 5.000 |
| Polyfox 6520 | 0.0020 | 0.002 | 0.002 | 0.0020 |
| Byk 361-N | 1.0000 | 1.000 | 1.000 | 1.0000 |
| PVP | 0.005 | | | 0.005 |
| Stabilizer Additive | | | | |
| IR-1035 | 0.05 | 0.1 | 0.075 | |
| IR-1010 | | | | |
| HP-136 | 0.01 | | | |
| BHT | | | | |
| Propyl Gallate | | | | 0.01 |
| Exposed Strip Green Strength | Excellent | Good | Excellent | Fair |
| Photospeed | | | | |
| E10 (mJ/cm$^2$) | 29.09 | | 45.49 | 31.15 |
| Dp (mm) | 0.30 | | 0.26 | 0.27 |
| Exposure Stability Test | | | | |
| 20 gm petri-dish PCA | Pass | Pass | Pass | Pass |
| 15 gm petri-dish PCA | | Pass | Pass | |

To test the stability of Comparative Examples 2-5 and Examples 13-39 in Table II, only the 20-gram petri-dish test was used. In each case, rather than a pass-fail rating, the onset of brown, black, or smoking was noted as time of exposure to obtain the run-away reaction. A maximum of 20 minutes exposure was given for all the samples. In all cases, addition of antioxidant increased the time to run-away reaction and higher antioxidant levels further increased the stability time.

TABLE II

|  | Comp. 2 | Ex. 13 | Ex. 14 | Ex. 15 |
|---|---|---|---|---|
| Base Composition | | | | |
| Epon 825 | 91 | 91 | 91 | 91 |
| UVR-6105 | | | | |
| Grilonit F713 | | | | |
| Rhodorsil 2074 | 1 | 1 | 1 | 1 |
| OXT-101 | | | | |
| Chivacure BMS | | | | |
| Isopropyl Thioxanthone | | | | |
| Chivacure 173 | 8 | 8 | 8 | 8 |
| Stabilizer Additive | | | | |
| IR-1035 | | 0.075 | 0.1 | 0.15 |
| IR-1010 | | | | |
| Longnox-10 | | | | |
| HP-136 | | | | |
| BHT | | | | |

TABLE II-continued

| Exposure Stability Test | | | | | | | | |
|---|---|---|---|---|---|---|---|---|
| 20 gm petri-dish PCA | | Dark Brown starts at 2.4 min | Dark Brown starts at 2.9 min | Dark Straw starts at 3.5 min | Straw at 4.5 | | | |
| | Comp. 3 | Ex. 16 | Ex. 17 | Ex. 18 | Ex. 19 | Ex. 20 | Ex. 21 | Ex. 22 |
| Base Composition | | | | | | | | |
| Epon 825 | 88.9 | 88.9 | 88.9 | 88.9 | 88.9 | 88.9 | 88.9 | 88.9 |
| UVR-6105 | | | | | | | | |
| Grilonit F713 | | | | | | | | |
| Rhodorsil 2074 | 0.9 | 0.9 | 0.9 | 0.9 | 0.9 | 0.9 | 0.9 | 0.9 |
| OXT-101 | 10 | 10 | 10 | 10 | 10 | 10 | 10 | 10 |
| Chivacure BMS | 0.2 | 0.2 | 0.2 | 0.2 | 0.2 | 0.2 | 0.2 | 0.2 |
| Isopropyl Thioxanthone | | | | | | | | |
| Chivacure 173 | | | | | | | | |
| Stabilizer Additive | | | | | | | | |
| IR-1035 | | 0.075 | 0.1 | 0.2 | | | | |
| IR-1010 | | | | | | | | |
| Longnox-10 | | | | | | | | |
| HP-136 | | | | | 0.05 | 0.1 | 0.2 | 0.5 |
| BHT | | | | | | | | |
| Exposure Stability Test | | | | | | | | |
| 20 gm petri-dish PCA | Browning at 2.6 min | Browning at 3.1 min | Brown Splotches at 4.7 min | Stable | 1 Browning at 2.9 min | Browning at 3.1 min | Browning at 3.4 min | Browning at 3.6 min |

| | Comp. 4 | Ex. 23 | Ex. 24 |
|---|---|---|---|
| Base Composition | | | |
| Epon 825 | | | |
| UVR-6105 | 99.53 | 99.53 | 99.53 |
| Grilonit F713 | | | |
| Rhodorsil 2074 | 0.2 | 0.2 | 0.2 |
| OXT-101 | | | |
| Chivacure BMS | 0.27 | 0.27 | 0.27 |
| Isopropyl Thioxanthone | | | |
| Chivacure 173 | | | |
| Stabilizer Additive | | | |
| IR-1035 | | 0.1 | |
| IR-1010 | | | |
| Longnox-10 | | | |
| HP-136 | | | 0.5 |
| BHT | | | |
| Exposure Stability Test | | | |
| 20 gm petri-dish PCA | Browning and smoking at 4 min | Stable after 10 min exposure | Browning and smoking at 6.3 min |

| | Comp. 5 | Ex. 25 | Ex. 26 | Ex. 27 |
|---|---|---|---|---|
| Base Composition | | | | |
| Epon 825 | | | | |
| UVR-6105 | | | | |
| Grilonit F713 | 99.35 | 99.35 | 99.35 | 99.35 |
| Rhodorsil 2074 | 0.5 | 0.5 | 0.5 | 0.5 |
| OXT-101 | | | | |
| Chivacure BMS | | | | |
| Isopropyl Thioxanthone | 0.15 | 0.15 | 0.15 | 0.15 |
| Chivacure 173 | | | | |
| Stabilizer Additive | | | | |
| IR-1035 | 0 | 0.75 | 0.1 | 0.2 |
| IR-1010 | | | | |
| Longnox-10 | | | | |
| HP-136 | | | | |
| BHT | | | | |

TABLE II-continued

| Exposure Stability Test | | | | | |
|---|---|---|---|---|---|
| 20 gm petri-dish PCA | Brown at 9.6 min | Browning at 11 min | Browning at 11 min | Light browning at 14.4 min not runaway after 20 min | |

| | Ex. 28 | Ex. 29 | Ex. 30 | Ex. 31 | Ex. 32 | Ex. 33 |
|---|---|---|---|---|---|---|
| Base Composition | | | | | | |
| Epon 825 | | | | | | |
| UVR-6105 | | | | | | |
| Grilonit F713 | 99.35 | 99.35 | 99.35 | 99.35 | 99.35 | 99.35 |
| Rhodorsil 2074 | 0.5 | 0.5 | 0.5 | 0.5 | 0.5 | 0.5 |
| OXT-101 | | | | | | |
| Chivacure BMS | | | | | | |
| Isopropyl Thioxanthone | 0.15 | 0.15 | 0.15 | 0.15 | 0.15 | 0.15 |
| Chivacure 173 | | | | | | |
| Stabilizer Additive | | | | | | |
| IR-1035 | | | | | | |
| IR-1010 | | | | | | |
| Longnox-10 | 0.1 | 0.2 | 0.5 | | | |
| HP-136 | | | | | | |
| BHT | | | | 0.01 | 0.02 | 0.05 |
| Exposure Stability Test | | | | | | |
| 20 gm petri-dish PCA | Browning at 11 min | Browning at 11.8 min | Browning at 12.8 min | Browning at 9.8 min | Browning at 10.4 min | Browning at 11.6 min |

| | Ex. 34 | Ex. 35 | Ex. 36 | Ex. 37 | Ex. 38 | Ex. 39 |
|---|---|---|---|---|---|---|
| Base Composition | | | | | | |
| Epon 825 | | | | | | |
| UVR-6105 | | | | | | |
| Grilonit F713 | 99.35 | 99.35 | 99.35 | 99.35 | 99.35 | 99.35 |
| Rhodorsil 2074 | 0.5 | 0.5 | 0.5 | 0.5 | 0.5 | 0.5 |
| OXT-101 | | | | | | |
| Chivacure BMS | | | | | | |
| Isopropyl Thioxanthone | 0.15 | 0.15 | 0.15 | 0.15 | 0.15 | 0.15 |
| Chivacure 173 | | | | | | |
| Stabilizer Additive | | | | | | |
| IR-1035 | | | | | | |
| IR-1010 | 0.1 | 0.2 | 0.5 | | | |
| Longnox-10 | | | | | | |
| HP-136 | | | | 0.02 | 0.05 | 0.1 |
| BHT | | | | | | |
| Exposure Stability Test | | | | | | |
| 20 gm petri-dish PCA | Browning at 14.1 min | Browning at 14.8 min | Browning at 16 min | Browning at 10.7 min | Browning at 11.4 min | Browning at 12.9 min |

The resin compositions of the present invention are preferably used in a layer-by-layer process wherein a three-dimensional object is prepared. Examples of such a process are; a stereolithography process; an ink-jet process in which photopolymer is jetted or extruded imagewise and exposed with actinic radiation to harden the photopolymer; an ink-jet or extrusion process wherein a non-actinic material is deposited in the negative of the image and a photopolymer is coated or jetted in the positive of the image and subsequently or simultaneously exposed to actinic radiation to harden the photopolymer; a process similar to stereolithography wherein exposures are made through a mask or reflected off a mask, either onto a photopolymer surface or through a clear surface, and wherein said exposures substantially harden the photopolymer; and the like.

Within the chamber of a stereolithography apparatus, a vat of composition, for instance, Example 11, was provided in which a platform was placed that was substantially co-planar with the surface of the composition of the vat. The platform was dipped below the surface of the composition and raised to approximately 0.02 cm lower than the composition surface. Then the composition was smoothed with a doctor blade to create a substantially uniform layer approximately 0.02 cm thick on the platform surface.

Next, the layer of composition was exposed imagewise with a frequency tripled Solid State laser beam having an approximate wavelength output of 354.7 nm and power of 110 mW at the image plane. The beam was focused to approximately 0.022 cm $1/e^2$ beam diameter at the image plane composition surface and the laser had a pulse frequency of 80 kHz. The exposure was conducted in a line-by-line manner with the beam scanned in the Y-direction and incremented in the X direction. The incrementation was spaced approximately 0.0076 cm apart. An exposure of 71.23 mJ/cm$^2$ was provided to the composition within the image region in order to induce photohardening imagewise. Such exposure is capable of hardening the composition to approximately 0.033 cm. Therefore the composition was given approximately 0.013 cm extra exposure than needed to harden the 0.02 cm layer. This extra exposure assures adhesion to the platform or adhesion to previous layers.

After the imagewise exposure, the platform was again dipped below the surface of the composition, allowing unexposed composition to coat the platform or previously exposed layer surface. Then the platform was brought back up such that the surface of the previously exposed layer was approximately 0.02 cm below the composition surface. Again the doctor blade was used to smooth the composition forming a layer approximately 0.02 cm thick above the previously imaged layer surface. Then a new imagewise exposure of approximately 71.23 mJ/cm$^2$ was provided to the composition surface. The process was continued until tensile bars (ASTM D638M Type M1 approximately 1 cm thick) were fabricated. After fabrication, the bars were removed from the platform, cleaned in propylene carbonate, rinsed in isopropyl alcohol, and then allowed to dry. Finally the tensile bars were post-exposed in a PCA (obtained from 3-D Systems) for one hour. Other shape parts were also made.

The stereolithography process described above was repeated utilizing the base composition of Example 11 to which was added 0.075% Irganox 1035. With the addition of the Irganox 1035, parts are successfully fabricated. The process can be used to fabricate Quick-Cast patterns and to fabricate molds. The molds can be used for applications such as injection molding and/or thermoplastic sheet vacuum-molding.

Although illustrated and described herein with reference to certain specific embodiments, the present invention is nevertheless not intended to be limited to the details shown. Rather, various modifications may be made in the details within the scope and range of the equivalents of the claims without departing from the spirit of the invention.

The invention claimed is:

1. A cationically polymerizable composition comprising:
   a) a cationically polymerizable compound;
   b) an iodonium-based cationic initiator;
   c) a photosensitizer for said cationic initiator; and
   d) an antioxidant selected from the group consisting of lactone antioxidants, and combinations of phenol and lactone antioxidants.

2. The composition according to claim 1, wherein said cationically polymerizable compound comprises at least one of epoxide-containing compounds, and oxetane.

3. The composition according to claim 1, further comprising a hydroxyl-functional compound.

4. The composition according to claim 1, further comprising a meth(acrylate).

5. The composition according to claim 4, further comprising a free-radical initiator.

6. The composition according to claim 1, wherein the photosensitizer is 4-benzoyl-4'-methyldiphenyl sulfide.

7. The composition according to claim 1, wherein the photosensitizer is present in an amount to provide a depth of penetration (Dp) from about 0.005 cm to about 0.03 cm.

8. The composition according to claim 1, wherein the weight percentage of said antioxidant is 0.01 wt % to 2 wt %, relative to the total weight of the composition.

9. The composition according to claim 1, wherein the composition, when coated on a surface or within a vat, has a thickness of 0.4 cm or more.

10. The composition according to claim 1, wherein the composition passes the Exposure Stability Test.

11. A method of reducing the potential for a run-away polymerization in a process which exposes a polymerizable composition to actinic radiation, the method comprising incorporating into an iodonium-based composition an amount of an antioxidant sufficient to reduce the potential for run-away polymerization when the composition is exposed in-bulk to actinic radiation, wherein the antioxidant is selected from the group consisting of lactone antioxidants and combinations of phenol and lactone antioxidants.

12. The method according to claim 11 wherein said process is a stereolithography process.

13. A method of forming a cationically cured material comprising subjecting the cationically curable composition according to claim 1 to cationic curing conditions for a period of time sufficient to form a cured material therefrom.

14. A method of forming a three-dimensional article comprising
   a) coating a layer of the cationically curable composition according to claim 1 onto a surface;
   b) exposing the layer imagewise to actinic radiation to form an imaged cross-section, wherein the radiation provides sufficient exposure to cause substantial curing of the layer in the exposed areas;
   c) coating a layer of the composition onto the previously exposed imaged cross-section;
   d) exposing the layer from step c) to imagewise actinic radiation to form an additional imaged cross-section, wherein the radiation is of sufficient intensity to cause substantial curing of the layer in the exposed areas and to cause adhesion to the previously exposed imaged cross-section; and
   e) repeating steps c) and d) a sufficient number of times in order to build up the three-dimensional article.

15. The method according to claim 14, wherein said article is a mold.

16. The method according to claim 14, wherein said article is a pattern.

17. A process for making a three-dimensional article comprising:
   a) forming a mold from the composition according to claim 1;
   b) forming a thermoplastic sheet on the mold via vacuum-forming techniques.

18. A mold or pattern formed from the composition according to claim 1.

19. A cationically polymerizable iodonium-based composition comprising:
   a) a cationically polymerizable compound;
   b) an iodonium-based cationic initiator;
   c) a photosensitizer for said cationic initiator; and
   d) an amount of an antioxidant sufficient to reduce the tendency of run-away reaction when the composition is exposed in-bulk to actinic radiation, wherein the antioxidant is selected from the group consisting of lactone antioxidants, and combinations of phenol and lactone antioxidants.

* * * * *

UNITED STATES PATENT AND TRADEMARK OFFICE
CERTIFICATE OF CORRECTION

| | | |
|---|---|---|
| PATENT NO. | : 7,696,260 B2 | Page 1 of 1 |
| APPLICATION NO. | : 11/392866 | |
| DATED | : April 13, 2010 | |
| INVENTOR(S) | : Ren et al. | |

It is certified that error appears in the above-identified patent and that said Letters Patent is hereby corrected as shown below:

Title Page;
Item (75), Inventors: "Kangtal Ren" should read --Kangtai Ren--.

Signed and Sealed this

First Day of June, 2010

David J. Kappos
*Director of the United States Patent and Trademark Office*